United States Patent [19]

Yu et al.

[11] Patent Number: 4,886,954
[45] Date of Patent: Dec. 12, 1989

[54] HOT WALL DIFFUSION FURNACE AND METHOD FOR OPERATING THE FURNACE

[75] Inventors: Chorng-Tao Yu, Placentia; Michael A. Fisk, Anaheim; Alan Emami, Huntington Beach, all of Calif.

[73] Assignee: Thermco Systems, Inc., Orange, Calif.

[21] Appl. No.: 181,787

[22] Filed: Apr. 15, 1988

[51] Int. Cl.[4] .............................................. H05B 3/62
[52] U.S. Cl. .................................... 219/390; 219/411; 219/388
[58] Field of Search ............... 219/390, 405, 411, 395, 219/398, 413, 406, 409, 388; 373/117, 109, 135, 136

[56] References Cited

U.S. PATENT DOCUMENTS

| | | |
|---|---|---|
| 3,311,694 | 3/1967 | Lasch, Jr. .................. 219/390 X |
| 3,385,921 | 5/1968 | Hampton .................... 219/390 X |
| 3,385,953 | 5/1968 | Henneberger ................. 219/390 |
| 4,348,580 | 9/1982 | Drexel ...................... 219/390 |
| 4,554,437 | 11/1985 | Wagner et al. ............... 219/388 |
| 4,711,989 | 12/1987 | Yu .......................... 219/390 |

*Primary Examiner*—Teresa J. Walberg
*Attorney, Agent, or Firm*—William B. Walker

[57] ABSTRACT

A diffusion furnace and method for processing semiconductor wafers standing on edge wherein the furnace has vertically adjacent electrical resistance heating elements wired in parallel and disposed above the wafers. This arrangement enables the heat input to the furnace by the heating elements to be varied. In a preferred embodiment, the heating elements in the upper section of the tube are connected in one circuit and the heating elements in the lower section of the tube are connected in a second circuit and each circuit is controlled in response to the temperature in that section.

10 Claims, 4 Drawing Sheets

HOT WALL DIFFUSION FURNACE AND METHOD FOR OPERATING THE FURNACE

FIELD OF THE INVENTION

The present invention relates to hot wall diffusion furnaces and method for processing semiconductor wafers in a processing chamber at high temperatures and, more particularly, to furnaces in which the semiconductors are stood on edge with their faces vertically disposed.

DISCUSSION OF THE BACKGROUND

Depending upon the particular process (which may include a diffusion, annealing or deposition step), wafers are treated at temperatures of from about 250° C. to about 1300° C. under very closely controlled conditions in rather sophisticated furnaces. U.S. Pat. No. 4,348,580 discloses a typical horizontal furnace, and U.S. Pat. No. 4,547,404 discloses a typical vertical furnace. Such furnaces have resistance heating elements disposed about the outside of the processing chamber for heating the wafers and gases in the processing chamber to a processing temperature. As these patents indicate, wafers are placed in the so-called "flat temperature zone" of the processing chamber where the temperature can be controlled by +0.5° C. of the temperature set point according to U.S. Pat. No. 4,348,580 or the temperature differential in the zone can be held to less than 2° C. according to U.S. Pat. No. 4,547,404.

Although the temperature across the horizontal length of the flat zone may be controlled within the specified limits in commercial furnaces, the top to bottom temperature along the vertical height of the flat zone is not monitored. Rather, gas flow is assumed to maintain a reasonably constant (but undefined) process temperature in the annular space between the wafers and the facing wall of the processing chamber. The fact is, however, that the annular temperature around the wafers may be substantially different and this difference may vary significantly depending upon the process temperature. Notwithstanding the flow of gas through the processing chamber and the turbulence induced by the internal configuration of the processing chamber in the gas, thermal convection currents in the narrow annular space between the wafers and the wall of the processing chamber have an unexpectedly significant effect. The temperature differential is particularly severe in low temperature processes in 250° C. to 450° C. range where radiation is not as significant a factor as it is above about 450° C.

The top to bottom temperature differential in the flat zone inherent in the prior art practice was dramatically shown in tests summarized by FIG. 1. The tests were conducted in a horizontal diffusion furnace comprising a conventional quartz processing tube having an internal diameter of 225 mm and length of about 1.2 meters. A boat loaded with 50 6" wafers was placed in the flat temperature zone of the tube which is the central zone between the load end zone and the source end zone. The tube was maintained at about atmospheric pressure with about 10 standard liters per minute nitrogen continuously flowing through it. The tube temperature was controlled by a helically formed electrical resistance element positioned coaxial with and encircling the tube with the load, central and source temperature zones being connected in series with each zone controlled in response to the temperature monitored under the portion of the boat in or nearest such zone. The nominal temperature in the atmosphere of the central zone was measured by a thermocouple located near the boat's midpoint ("T bottom"). The temperature at the top of the central zone ("T top") was measured by a second thermocouple located above the wafers vertically above the thermocouple under the boat. The temperature differential in the central zone was calculated as the difference between the temperatures sensed by these two thermocouples.

FIG. 1 indicates the steady state temperature differential (T top-T bottom) in the central temperature zone as a function of the process temperature (T bottom). Curve 10 shows that there is a steady state top to bottom temperature differential inherent in the prior art. As curve 10 shows, the differential in the above described furnace was about 5° C. at a process temperature of 250° C. and decreased with increasing temperature. The temperature differential did not come within 1° C. of the process temperature until the process temperature was about 1000° C.

SUMMARY OF THE INVENTION

The hot wall diffusion furnace of the present invention does, in fact, maintain the top to bottom temperature differential in a processing chamber to less than +1° C. Curve 12 of FIG. 1 indicates the steady state temperature differential in the same horizontal furnace discussed above but embodying the present invention. As curve 12 also shows, the temperature differential is independent of the process temperature in the improved furnace.

The improved furnace achieves these results with a plurality of vertically displaced, adjacent heating elements disposed about the flat temperature zone of the processing chamber for inputting different amounts of heat per unit area to vertically displaced, adjacent segments of the zone. In horizontal furnaces, the vertically displaced, adjacent segments are preferably disposed in a central zone between end zones which, most preferably, have vertically displaced, adjacent heating elements as well.

Preferably, each vertically displaced, adjacent element comprises an electric resistance wire and the elements are electrically connected in parallel. This configuration permits the relative heat inputs in each zone to be essentially established by the resistance of the elements because power is inversely proportional to resistance at constant voltage.

BRIEF DESCRIPTION OF THE DRAWINGS

These and other details, objects, and advantages of the invention will become apparent as the following description of the present preferred embodiment thereof proceeds.

In the accompanying drawings, a present preferred embodiment of the invention is shown, in which.

DESCRIPTION OF THE PREFERRED EMBODIMENT

Figure 4:
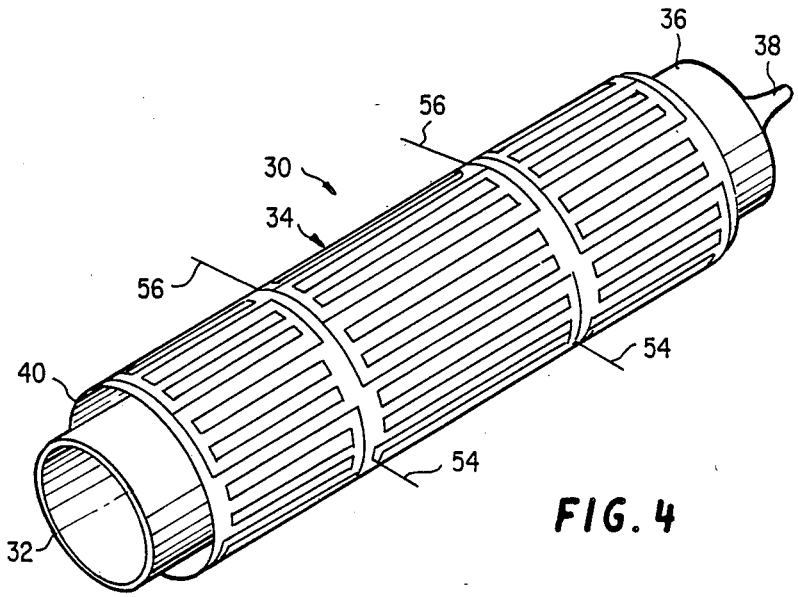
FIG. 4 is a perspective schematic of a horizontal furnace embodying the present invention.
Figure 5:
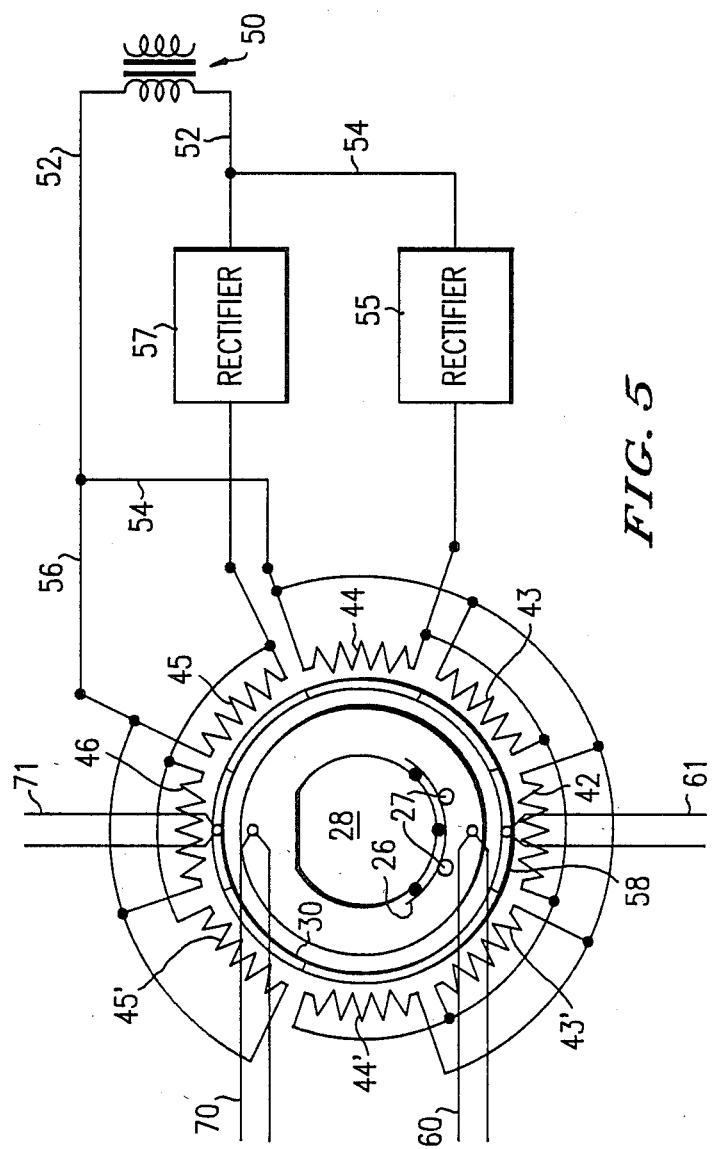
FIG. 5 is a schematic cross section of the central zone of the furnace of FIG. 4 connected to a power source.

FIGS. 4 and 5 show a horizontal diffusion tube 30 such as the 225 mm diameter by 1.2 meters long tube mentioned above. The tube 30 has an open unflanged load end 32 for loading and unloading one or more boats 26 carrying wafers 28 into a central portion 34 by a cantilever boat loader 27 (FIG. 5) and a source gas end 36 having a nozzle 38 connected to a manifold (not shown) for introducing various gases into the tube 30 for processing the wafers 28. The gases flow past the wafers 28 and out of the load end 32 of the tube 30 into a scavenger unit or other exhaust device (not shown).

The diffusion tube 30 depicted in FIGS. 4 and 5 is received within a cylindrical refractory tube 40 which is made up of a plurality of vacuum formed segments each having lengthwise extending channels on its inner diameter to receive and support a plurality of peripherally spaced heating elements 42, 43, 43', 44, 44', 45, 45' and 46. The horizontally opposed pairs of elements 43, 43' and 44, 44' and 45, 45', are connected as shown in FIG. 5 and together with the elements 42 and 46 provide sets of heating elements which are vertically displaced and adjacent to each other around the periphery of the tube 30 in the flat temperature zone in the central portion 34. Fewer than eight or additional heating elements may be used depending upon the control desired. Each segment of the tube 40 supports one heating element and covers about 45° of the peripheral surface of the tube 30. Each heating element comprises windings of a 0.045 inch diameter wire having resistance of about 0.432 ohms/foot at 68° F. The windings may be straight lengths, spiralled or have other suitable shapes. Also, the windings are connected in parallel for receiving 120 volt power via bus 52 from a three phase transformer 50, which conventionally provides one phase of its power to each of the load end 32, the central portion 34 and the source end 36 of the diffusion tube. The parallel arrangement of the heating elements enables the power to be distributed about the tube in accordance with the basic relationship Power=(Voltage)$^2$/R. In one eight element embodiment, the power was distributed as follows in the center zone and the end zones:

| Element | Distribution | Resistance of Each Element | Full Power for Each Element |
|---|---|---|---|
| Center Zone | | | |
| 46 (top) | .75 | 18.82 | 765 |
| 45, 45' | .83 | 17.01 | 847 |
| 44, 44' | .90 | 15.69 | 918 |
| 43, 43' | .95 | 14.86 | 969 |
| 42 (bottom) | 1.00 | 14.12 | 1020 |
| End Zones | | | |
| 46 (top) | .80 | 15.00 | 960 |
| 45, 45' | .87 | 13.79 | 1044 |
| 44, 44' | .93 | 12.90 | 1116 |
| 43, 43' | .97 | 12.37 | 1164 |

-continued

| Element | Distribution | Resistance of Each Element | Full Power for Each Element |
|---|---|---|---|
| 42 (bottom) | 1.00 | 12.00 | 1200 |

Other arrangements and configurations may be utilized so long as the differential temperature about the wafers is suitably controlled. Thus, for example, other heating elements may be used or other segmented designs may be employed, or other power sources utilized. The relative resistances of the vertically displaced elements set forth above were selected to compensate for the various effects at a certain operating temperature which gave rise to a top to bottom temperature differential across the wafers being processed. Obviously, the optimum resistances will differ for each furnace and the operating temperature. Accordingly, since most furnaces will be operated at many different processing temperatures, it is necessary to provide controls that permit further variation in the power to the vertically displaced adjacent elements of the furnace as will be described in further detail below.

The tube 30 shown in FIG. 4 also has vertically displaced adjacent heating elements supported on segmented arbor 40 about the load end 32 and source end 36. These elements are arranged and powered like the heating elements 42, 43, 43', 44, 44', 45, 45' and 46 disposed about the central portion 34 of the tube 30. Thus, these other heating elements and their operation need not be described further. These other elements may, however, be otherwise arranged or powered. Also, conventional helical wound elements may be disposed about the peripheral surfaces of load end 32 and the source end 36 of the tube 30 depending upon the degree of control which is required.

For the purpose of varying the relative wattage supplied to vertically displaced adjacent elements, it is preferable to separate the diffusion tube 30 into an upper controlled section and a lower controlled section. Controlling sections in this manner facilitates good dynamic temperature response by the tube as well as improving the static temperatures over a wide range of operating temperatures. Accordingly, the heating elements 42, 43', 43, 44' and 44 in the lower section of the central portion 34 are connected in parallel on one circuit comprising a sub-bus 54 and a silicon controlled rectifier 55. Similarly, the heating elements 45', 45 and 46 in the upper section of the central portion 34 are connected in parallel with each other on a second circuit connected in parallel with the first circuit comprising a second sub-bus 56 and silicon controlled rectifier 57. The rectifiers 55 and 57 are preferably operated independently. One section with a single control may be employed where dynamic response is not a concern and more than two sections with more than two controls may be employed. Upper and lower sections are sufficient to control the temperature during steady state processing, ramping up and ramping down steps.

The power input into the upper and lower sections of the tube 30 may be controlled in response to the temperature of the local tube atmosphere or the heating elements in the sections or both. Thus, the lower section may be conventionally controlled by a profile thermocouple 60 or a spike thermocouple 61 or by a ratio average of the two temperatures sensed by these two thermocouples. The ratio average technique is disclosed in detail in U.S. Pat. No. 4,711,987 which disclosure is hereby incorporated by this reference. Similarly, the upper section may be controlled by a profile thermocouple 70 or a spike thermocouple 71 or both.

Figure 6:
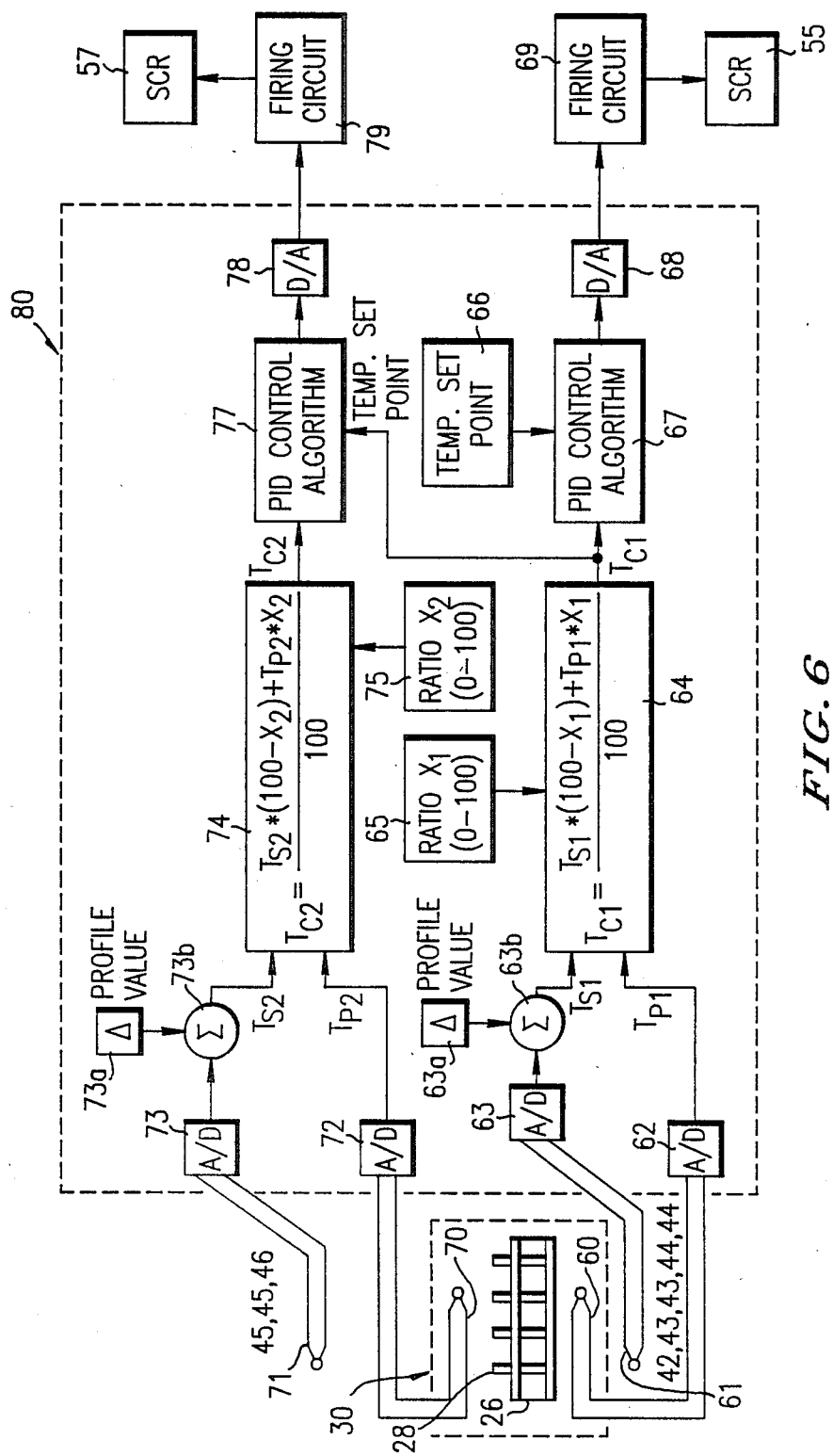
FIG. 6 is a block diagram showing the operation of the central zone of the furnace of FIG. 4.

FIG. 6 generally depicts the processing tube 30 of FIGS. 4 and 5 together with a microprocessor based digital controller 80 for controlling the process temperature. The temperatures sensed in the bottom of the tube 30 by the profile thermocouple 60 and/or the spike thermocouple 61 are output as linear millivolt signals to analog-to-digital converters 62 and 63 respectively which then feeds digital signals to a ratio average mixer 64 (such as that disclosed by U.S. Pat. No. 4,711,987) where they are mixed in accordance with a ratio average established by the select circuit ratio selector 65. Normally, the digital signal from the spike signal converter 63 will be corrected by combining a signal from a profile variable monitor 63a in circuit 63b to compensate for the actual temperature difference between the element and the atmospheric temperature. The profile variable values stored in memory of monitor 63a are obtained by conventional procedures in profiling the process. As explained in greater detail in U.S. Pat. No. 4,711,987, the mixer 64 receives the two temperature signals (digital in this case) which represent the profile and adjusted spike temperatures for the lower section to produce a lower section control temperature in accordance with the formula:

$$T_{C1} = \frac{T_{S1} * (100 - X_1) + T_{P1} * X_1}{100}$$

where
$T_{C1}$ = control temperature in the bottom section;
$T_{S1}$ = spike temperature in the bottom section;
$T_{P1}$ = profile temperature in the bottom section; and
$X_1$ = mix ratio from 0 to 100 for bottom section as selected in ratio controller 65

A PID control 67 subtracts the output signal from the mixer 64 from a set point value supplied by set point selector 66 to generate an error value which is processed in accordance with a control algorithm by the control 67. The processed signal which relates to the percent of full power to be applied to the lower heater section is then output to a digital-to-analog converter 68 which feeds the linearized signal to the silicon controlled rectifier 55 via a firing circuit 69. The rectifier 55 then regulates the electrical current flowing through the heating elements 42, 43, 43', 44 and 44' in the bottom section of the tube 30.

The temperature sensed in the top of the tube 30 by the profile thermocouple 70 and/or the spike thermocouple 71 are output as linear millivolt signals to analog-to-digital converters 72 and 73 respectively which in turn output digital signals to a signal ratio mixer 74. As noted above, the digital signal from the spike converter 73 is normally corrected by a profile variable monitor 73a to compensate for the temperature difference between the heating elements and the process temperature with the profile variable signal and the spike temperature being combined by circuit 73b providing a corrected upper section spike temperature to the mixer 74. The mixer 74 then averages the signals in accordance with a ratio determined by ratio selector 75. Mixer 74 then outputs the upper section temperature control signal to a PID control 77. The mixer 74 performs the same function with respect to the profile and adjusted spike temperatures as were performed in the mixer 64 in connection with the lower section temperatures. Mixer 74 creates an upper section control temperature signal in accordance with the following formula:

$$T_{C2} = \frac{T_{S2} * (100 - X_2) + T_{P2} * X_2}{100}$$

where
$T_{C2}$ = control temperature (top section);
$T_{S2}$ = spike temperature (top section);
$T_{P2}$ = profile temperature (top section);
$X_2$ = mix ratio (0-100, top section).

To achieve the objectives of the invention in obtaining a minimum temperature differential across the wafers from top to bottom in dynamic situations when ramping up or down, it is important that the controls for the top and bottom sections be interconnected in a master slave relationship. In the embodiment illustrated in FIG. 6, the lower section temperature control signal is used to provide the temperature set point signal for the upper section being supplied to the PID control 77.

Figure 1:
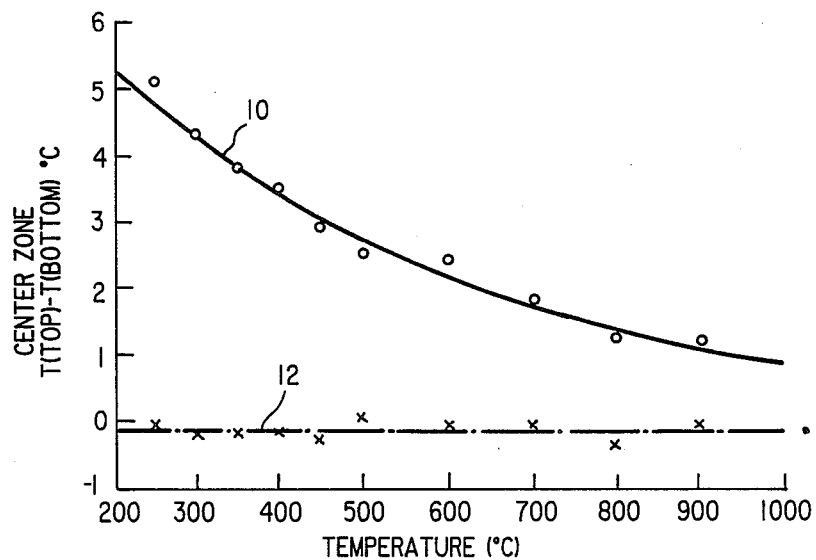
FIG. 1 is a graph showing the steady state temperature differentials of a prior art furnace and an improved furnace as a function of process temperature.

Depending on the ratio introduced into ratio selector 65, the temperature set point for the top section heating controller may be either the lower section corrected spike temperature ($X_1=0$) or the lower section profile temperature ($X_1=100$) or some average of the two lower section temperatures depending on the selected ratio between 0 and 100. To maintain a constant process temperature at the set point established for the lower section in selector 66 with minimum top to bottom temperature gradient, the best control is to select both $X_1$ and $X_2$ at 100. Under those conditions, the profile temperature in the bottom of the tube 30 regulates the controller output for the bottom section of the furnace zone. This temperature would also serve as the set point temperature for the top section controller. The control algorithm for PID control 77 responds to the top profile temperature and brings the error to zero, no matter what the bottom profile temperature reading is. Therefore, the top section is the slave to the bottom section master control zone. Curve 12 of FIG. 1 represents the test results of such control action. In these tests, furnace temperature was profiled and stabilized at various set point temperatures as established by selector 66 between 250° C. and 900° C. The top-to-bottom profile temperature differences at each set point was measured and the results were plotted against the set point temperature as curve 12. The selected ratio for both $X_1$ and $X_2$ for the list represented by curve 12 was 100. As will be seen on FIG. 1, this control scheme held the top to bottom temperature differential around the wafer ladened boat 26 to less than 0.5° C. throughout the 250° C. to 900° C. range.

The signal from the PID control 77 is supplied to a digital-to-analog converter 78 which feeds the analog signal through a firing circuit 79 to the silicon controlled rectifier 57. The rectifier 57 then regulates the electrical current flowing through the heating elements 45, 45', 46 in the upper section of the tube 30.

Figure 2:
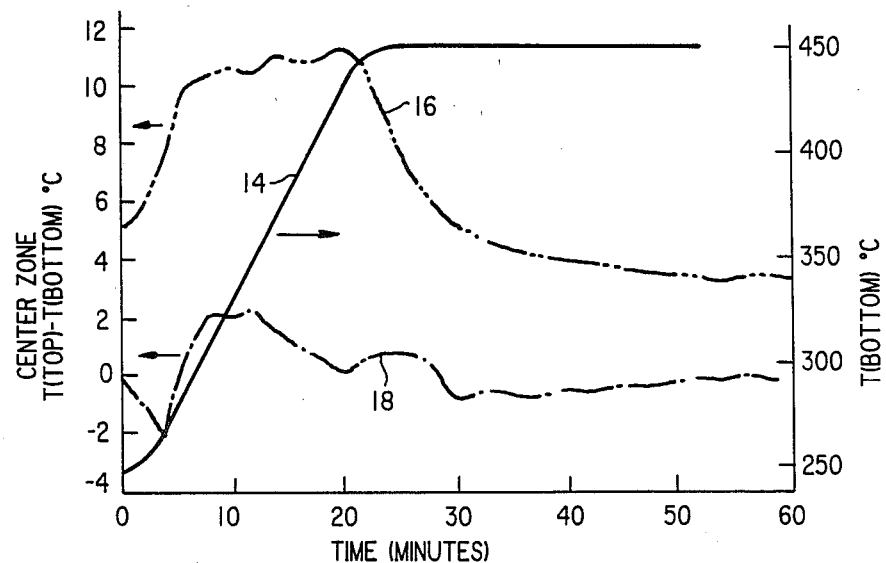
FIG. 2 is a graph showing the temperature response as a function of time of a prior art furnace and an improved furnace which were ramped up from 250° C. to 450° C.
Figure 3:
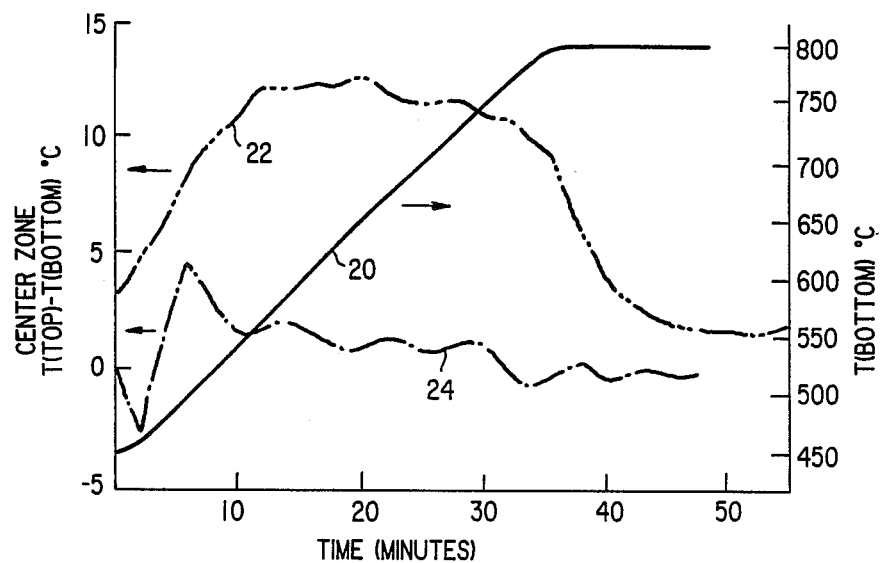
FIG. 3 is a graph showing the temperature response as a function of time of a prior art furnace and an improved furnace which were ramped up from 450° C. to 800° C.

FIGS. 2 and 3 indicate the temperature responses of the process tube 30 and a prior art configuration to temperature ramping. As above, 50 6-inch wafers were loaded into the central flat temperature zone of a 225 mm diameter tube and 10 standard liters per minute of nitrogen continuously flowed through the tube. The temperature was ramped up at a rate of 10° C./min from 250° C. to 450° C. (FIG. 2) and from 450° C. to 800° C. (FIG. 3). To obtain better dynamic response than did the configuration which achieved the 0.5° C. control in FIG. 1, the embodiment of the present invention employed ratio control in both the upper section and the lower section of the tube. As before, the prior art was simulated with the same configuration but employing a conventional helical wound resistance element with three zone controls where the portion of element in the central (flat temperature) zone was controlled in response to the profile temperature under the boat. In ramping up in both cases, the temperature differential of the furnace embodying the present invention stabilized to within +1° C. of the set point before the ramping step had even been completed and while the prior art temperature differential was still in its first cycle and peaking at about 10° C.

The following are the various set points and ratios employed in the tests reflected by the curves 14 and 20 of FIGS. 2 and 3, respectively:

| 250 C.–450 C. RAMP UP (FIG. 2) | |
|---|---|
| SETPOINT [66] | RAMP UP AT 10 c/min. |
| RATIO [65] | 50 for 0–25 min. |
| | 100 for greater than 25 min. |
| RATIO [75] | 95 for 0–2 min. |
| | 60 for 2–3 min. |
| | 40 for 3–20 min. |
| | 20 for 20–30 min. |
| | 100 for greater than 30 min. |
| 450 C.–800 C. RAMP UP (FIG. 3) | |
| SETPOINT [66] | RAMP UP at 10 C/min. |
| RATIO [65] | 40 for 0–30 min. |
| | 80 for 30–34 min. |
| | 100 for greater than 34 min. |
| RATIO [75] | 95 for 0–2 min. |
| | 60 for 2–12 min. |
| | 40 for 12–20 min. |
| | 30 for 20–27 min. |
| | 1 for 27–40 min. |
| | 100 for greater than 40 min. |

While a presently preferred embodiment of the invention has been shown and described together with certain preferred methods of practicing the same, it is to be distinctly understood that the invention is not to be limited thereto but may be otherwise variously embodied and practiced within the scope of the following claims.

What is claimed as new and desired to be secured by Letters Patent of the United States is:

1. A hot wall diffusion furnace for processing semiconductor wafers in a flat temperature zone of a processing chamber comprising a plurality of separate heating elements being coextensive with a length of said flat temperature zone and being spaced peripherally around said processing chamber, a first group and a second group of said heating elements, said first group being adjacent each other and being positioned above the elements of said second group, first power control means and second power control means connected to said first group and said second group of heating elements, respectively, first temperature sensing means responsive to temperature at a top portion of said processing chamber and second temperature sensing means temperature to temperature at a bottom portion of said processing chamber, said first and second temperature sensing means being connected, respectively, to said first and second power control means to control power to said first and second group of heating elements to equalize temperature between the top and bottom of said processing chamber wherein the resistance of the heating elements of said first group is greater than the resistance of said heating elements in said second group to equalize temperature across a vertical height of said chamber.

2. The hot wall diffusion furnace of claim 1 wherein said processing chamber is cylindrical with an axis extending horizontally, and said heating elements are connected in parallel.

3. The hot wall diffusion furnace of claim 1 wherein a lowermost of said heating elements having lower resistance values than said heating elements positioned above them with the resistance values being progressively higher going from bottom to top.

4. The hot wall diffusion furnace of claim 1 wherein said temperature sensing means each comprise a plurality of thermocouples responsive to heating element and processing chamber temperatures at either the top or bottom of said processing chamber, and which comprises ratio control means for varying the control response between said heating element and processing chamber temperatures.

5. The hot wall diffusion furnace of claim 4 wherein said second power control means comprises means for inputting a temperature setpoint, said first power control means being slaved to said second power control means to provide a temperature set point to said first power control means.

6. A hot wall diffusion furnace for processing semiconductor wafers in a flat temperature zone of a processing chamber comprising a processing chamber for receiving semiconductor wafers, means surrounding said chamber for supporting a plurality of vertically displaced adjacent heating elements disposed above a flat temperature zone, upper temperature sensing means and lower temperature sensing means associated with said heating elements and processing chamber, first power control means connected to an uppermost of said heating elements and to said upper temperature sensing means, and second power control means connected to a lowermost of said heating elements and to said lower temperature sensing means to supply different levels of power to said heating elements to equalize a temperature across a vertical height of said processing chamber wherein resistance of said heating elements disposed under the flat temperature zone is substantially less than resistance of said heating elements disposed above the flat temperature zone.

7. The invention of claim 6 wherein the heating elements are electrically connected in parallel.

8. A horizontal hot wall diffusion furnace, comprising:
a processing chamber with a flat temperature zone disposed between a wafer boat load zone and a source gas zone, and
means surrounding said chamber for supporting a plurality of vertically displaced adjacent electric heating elements, said electric heating elements being connected in parallel and disposed abut the flat temperature zone, said vertically adjacent heating elements above the flat temperature zone being connected in a first electrical circuit and said heating elements below the flat temperature zone being connected in a second electrical circuit and the two circuits being connected in parallel wherein resistance of said heating elements disposed below the flat temperature zone is substantially less than the resistance of the heating elements disposed above the flat temperature zone.

9. The invention of claim 8 wherein said means surrounding said chamber extends adjacent to a portion of said processing chamber including said wafer boat load zone and said source gas zone, a second and third plurality of vertically displaced adjacent heating elements being disposed about said wafer boat load zone and said source gas zone, respectively.

10. A method for controlling a temperature of an atmosphere around a semiconductor wafer in a processing chamber comprising the steps of:

providing a plurality of vertically displaced adjacent heating means of different resistance values surrounding the processing chamber;

monitoring a temperature of said processing chamber below the wafer;

supplying heat to a lowermost of said heating means in response to the temperature sensed below the wafer;

monitoring a temperature of said processing chamber above the wafer; and supplying heat to an uppermost of said heating means in response to the temperature sensed above the wafer and in response to the temperature sensed below the wafer so as to equalize the temperature across the height of said processing chamber.

* * * * *

UNITED STATES PATENT AND TRADEMARK OFFICE
CERTIFICATE OF CORRECTION

PATENT NO. : 4,886,954
DATED : December 12, 1989
INVENTOR(S) : Chorng-Tao Yu et al.

It is certified that error appears in the above-identified patent and that said Letters Patent is hereby corrected as shown below:

( Title Page ), item number 73 ( Assignee ), change "ThermCo Systems, Inc."

to --Silicon Valley Group, Inc.--.

Signed and Sealed this

Twenty-ninth Day of May, 2001

Attest:

NICHOLAS P. GODICI

*Attesting Officer*     *Acting Director of the United States Patent and Trademark Office*